United States Patent
Shimizu et al.

(10) Patent No.: US 11,908,812 B2
(45) Date of Patent: Feb. 20, 2024

(54) MULTI-DIE MEMORY DEVICE WITH PEAK CURRENT REDUCTION

(71) Applicant: Micron Technology, Inc., Boise, ID (US)

(72) Inventors: Yui Shimizu, San Jose, CA (US); James E. Davis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 17/176,787

(22) Filed: Feb. 16, 2021

(65) Prior Publication Data

US 2022/0199554 A1 Jun. 23, 2022

Related U.S. Application Data

(60) Provisional application No. 63/126,819, filed on Dec. 17, 2020.

(51) Int. Cl.
*H01L 23/60* (2006.01)
*H01L 25/065* (2023.01)
*H01L 25/00* (2006.01)

(52) U.S. Cl.
CPC .......... *H01L 23/60* (2013.01); *H01L 25/0657* (2013.01); *H01L 25/50* (2013.01); *H01L 2225/06506* (2013.01); *H01L 2225/06562* (2013.01)

(58) Field of Classification Search
CPC ..... H01L 23/60; H01L 25/0657; H01L 25/50; H01L 2225/0656; H01L 2225/06562; H10B 80/10
See application file for complete search history.

(56) References Cited

U.S. PATENT DOCUMENTS

| | | | |
|---|---|---|---|
| 10,312,232 B1 | 6/2019 | Davis et al. | |
| 10,403,585 B2 | 9/2019 | Davis | |
| 10,867,991 B2 | 12/2020 | Davis | |
| 2019/0148358 A1* | 5/2019 | Davis | H01L 24/49 257/532 |

* cited by examiner

*Primary Examiner* — Timor Karimy
(74) *Attorney, Agent, or Firm* — Lowenstein Sandler LLP

(57) ABSTRACT

A memory device including a substrate including a substrate contact pad. The memory device includes a first memory die including a first power supply contact pad electrically coupled to the substrate contact pad and a first power supply circuit on the first memory die. The first memory die further includes a first electrostatic discharge (ESD) power clamp contact pad electrically coupled to the substrate contact pad and a first ESD power clamp circuit on the first memory die. The memory device further includes a second memory die including a second power supply contact pad electrically coupled to the substrate contact pad and a second power supply circuit on the second memory die and a second ESD power clamp contact pad electrically coupled to a second ESD power clamp circuit on the second memory die, wherein the second ESD power clamp contact pad is electrically disconnected from the substrate contact.

20 Claims, 10 Drawing Sheets

MULTI-DIE MEMORY DEVICE WITH PEAK CURRENT REDUCTION

CROSS-REFERENCE TO RELATED APPLICATION

This application claims the benefit of U.S. Provisional Application No. 63/126,819, titled "Multi-Die Memory Device with Peak Current Reduction," filed Dec. 17, 2020, the entire disclosure of which is incorporated herein by reference.

TECHNICAL FIELD

Embodiments of the disclosure relate generally to memory sub-systems, and more specifically, relate to managing peak current levels and current consumption in a multi-die semiconductor device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
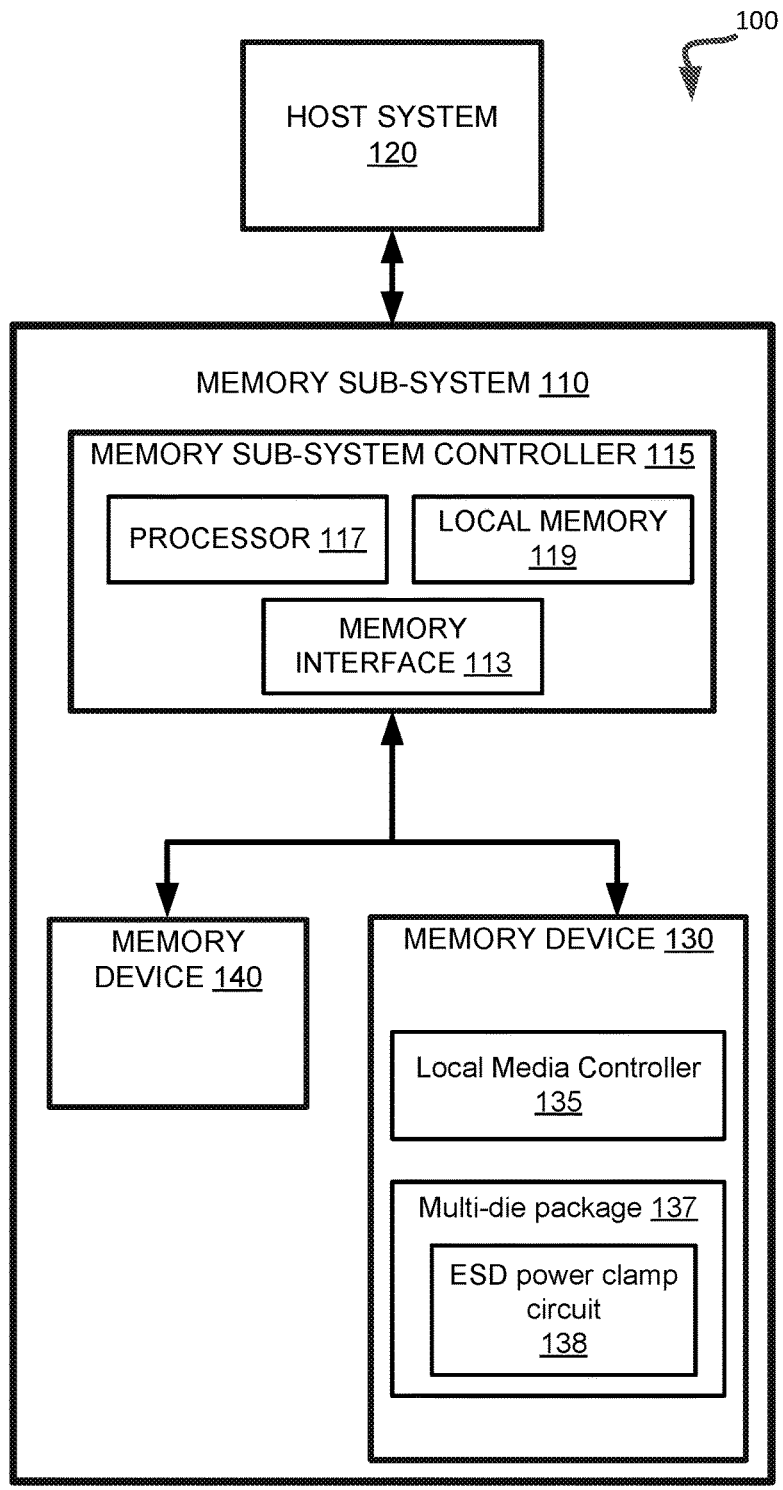
FIG. 1 illustrates an example computing system that includes a memory sub-system in accordance with some embodiments of the present disclosure.

Aspects of the present disclosure are directed to a semiconductor device including multiple semiconductor dies (e.g., memory dies) in a stacked assembly configured to reduce peak current levels during a power-on mode of operation and an overall current consumption level (e.g., standby current) of the semiconductor device. For example, the semiconductor device can include a memory device with multiple memory dies of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative- and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Packaged memory dies, including memory chips, microprocessor chips, and imager chips, typically include one or more memory dies mounted on a substrate and encased in an encapsulant (e.g., a plastic protective covering) or covered by a heat-conducting lid. The memory die can include active circuits (e.g., providing functional features such as power supplies, memory cells, processor circuits, and/or imager devices) and passive circuits (e.g., electrostatic discharge (ESD) circuits including one or more passive elements such as capacitors, resistors, etc.) and one or more bond pads electrically connected to the circuits. The bond pads can be electrically connected to terminals outside the protective covering to allow the memory die to be connected to higher level circuitry.

For example, a semiconductor device, such as a memory device assembly, can include multiple memory dies stacked in a shingled fashion on a substrate and covered by an encapsulant. Each memory die includes one or more contact pads to a corresponding integrated circuit. The contact pads can be connected to a substrate contact by wirebonds (e.g., in a daisy-chain configuration), to provide connectivity to the integrated circuits via solder ball.

With some semiconductor dies, various bond pads can be connected to multiple circuits in a memory die. For example, in a NAND memory die, a single bond pad may be connected to both an active driver circuit (e.g., a power supply) and a passive ESD protection circuit (e.g., including one or more capacitors). The ESD protection circuit can be designed to provide a desired amount of capacitance to protect the single active driver circuit (e.g., protects one or more transistors coupled to interface pins of an integrated circuit from electrostatic discharge).

In certain memory device assemblies including multiple memory dies with active driver circuits connected in parallel (e.g., with the corresponding bond pad from each memory die connected to the same external terminal or interface), the input/output (I/O) speed demands have increased. This presents a design challenge in balancing fast I/O operation speeds and the robustness of the ESD circuitry used to manage the effects of electrostatic discharge on the integrated circuits. One approach reduces I/O pin capacitance by reducing a number of ESD circuit elements and reducing a gate-contact distance of a pull-up or pull-down device. This, however, reduces the level of ESD management of the device.

To adequately protect the internal circuits of the memory device against ESD damage, an ESD power clamp circuit can be employed across a positive power supply (e.g., also referred to as "Vccq") and "0" volts or ground voltage (e.g., also referred to as "Vssq"). However, during a powering on mode of the memory device, the ESD power clamp circuit causes a significant spike or increase in a peak current level (e.g., also referred to as "Iccq") of the memory device which can degrade device performance.

Aspects of the present disclosure address the above and other deficiencies by implementing semiconductor device configurations including an arrangement of active circuits (e.g., power supply circuits or driver circuits) and passive circuits (e.g., ESD power clamp circuits) that manage the ESD levels in the semiconductor device while reducing the peak current levels during a power-on operation of the semiconductor device. In an embodiment, the semiconductor device includes a memory device having multiple memory dies. When memory dies with an ESD protection circuit (e.g., an ESD power clamp circuit) connected to a same bond pad as an active circuit (e.g., a power supply circuit or driver circuit) are connected together in different package densities (e.g., a package including two memory dies, a package including four memory dies, a package including four memory dies and a data bus, etc.), the peak current level consumed by the ESD protection circuit cannot be optimized for each package density. Accordingly, semiconductor devise, such as memory devices, in accordance with embodiments of the present disclosure can provide package-level configurability of a peak current level to overcome this challenge.

Aspects of the present disclosure are directed to semiconductor device assemblies including a substrate and multiple semiconductor dies coupled to the substrate. In an embodiment, the semiconductor device is a memory device including a first memory die of a multi-die assembly. The first memory die includes a first contact pad electrically coupled to a first circuit on the first memory die including at least one active circuit element (e.g., a power supply such as Vccq), and a second contact pad electrically coupled to a second circuit on the die including only passive circuit elements (e.g., an ESD power clamp circuit). In an embodiment, the substrate includes a substrate contact electrically coupled to both the first and second contact pads of the first memory die. The memory device assembly further includes a second memory die including a third contact pad electrically coupled to a third circuit on the second die including at least a second active circuit element (e.g. a power supply or driver circuit), and a fourth contact pad electrically coupled to a fourth circuit on the second die including only passive circuit elements (e.g., an ESD power clamp circuit). In an embodiment, to manage the peak current level associated with a powering-on operation of the memory device, the substrate contact (e.g., an interface pin) can be electrically coupled to the third contact pad and electrically disconnected from the fourth contact pad.

According to embodiments, one or more contact pads associated with an ESD clamp circuit of one or more memory dies in a multi-die memory device assembly can be electrically disconnected from the substrate interface. Advantageously, by maintaining the ESD power clamp circuit of the second memory die of the memory device electrically disconnected from the substrate interface arrangement, standby or leakage current is not consumed by the ESD power clamp circuit, thereby reducing the overall peak current level consumed by the memory device. Furthermore, electrically isolating one or more contact pads associated with an ESD clamp circuit of a multi-die memory device assembly results in no contribution to the peak current level by those ESD clamp circuits during a power-on operation. Moreover, a reduced level of current is consumed during operation of the semiconductor device since fewer ESD clamp circuits are connected. Advantageously, the reduced amount of current consumed in view of the reduced number of electrically connected ESD power clamp circuits results in a power savings and extension of battery life associated with the memory device.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative- and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

According to embodiments, the memory device 130 includes a multi-die package 135 including multiple memory dies assembled on a substrate. Each of the multiple memory dies includes one or more contact pads which are provided to enable an electrical connection with an integrated circuit with active components (herein referred to and schematically illustrated as a power supply circuit in FIGS. 3-6). In an embodiment, each of the multiple memory dies includes one or more separate or dedicated contact pads associated with an integrated circuit with passive components (herein referred to and schematically illustrated as an electrostatic discharge (ESD) power clamp circuit). In an embodiment, the one or more power supply circuit pads are arranged adjacent or next to a respective ESD power clamp circuit pad associated with one or more ESD power clamp circuits 138.

In an embodiment, the memory device 130 includes an assembled stack of the multiple memory dies in a multi-die package 137. Accordingly, the multi-die package includes a set of ESD power clamp pads associated with an ESD power clamp circuit 138 of the multiple memory dies in the package. In an embodiment, fewer than the entire set of ESD power clamp pads are bonded to a contact pad of the substrate (e.g., a contact pad associated with an I/O interface pin) or a corresponding power supply contact pad. Advantageously, use of a dedicated contact pad enables each of the memory die to be manufactured in the same manner, with flexibility in the configuration of the wired assembly of the multi-die package wherein one or more of the dedicated ESD power clamp contact pads can be electrically isolated (e.g., not electrically connected) with respect to a substrate contact pad. In an embodiment, by leaving one or more of the ESD power clamp contact pads electrically disconnected from the substrate contacts, an overall peak current level is reduced since the disconnected ESD power clamp will not consume current during a powering on of the memory device 130. In addition, the amount of current (e.g., standby or leakage current) consumed is reduced due to having one or more ESD power clamps that are electrically disconnected. These disconnected or unbonded ESD clamps do not draw current during operation of the memory device, thereby saving power and battery life.

In an embodiment, the ESD power clamp contact pad can be arranged or positioned on a ground side of the memory die (e.g., the ESD power clamp contact pad is arranged next to a 0 volt or ground power supply contact pad. In another embodiment, the ESD power clamp contact pad can be arranged or positioned on a power side of the memory die (e.g., the ESD power clamp contact pad is arranged next to a positive power supply. In yet another embodiment, the ESD power clamp contact pad can be arranged or positioned on both the power side and the ground side of the memory die.

Figure 2:
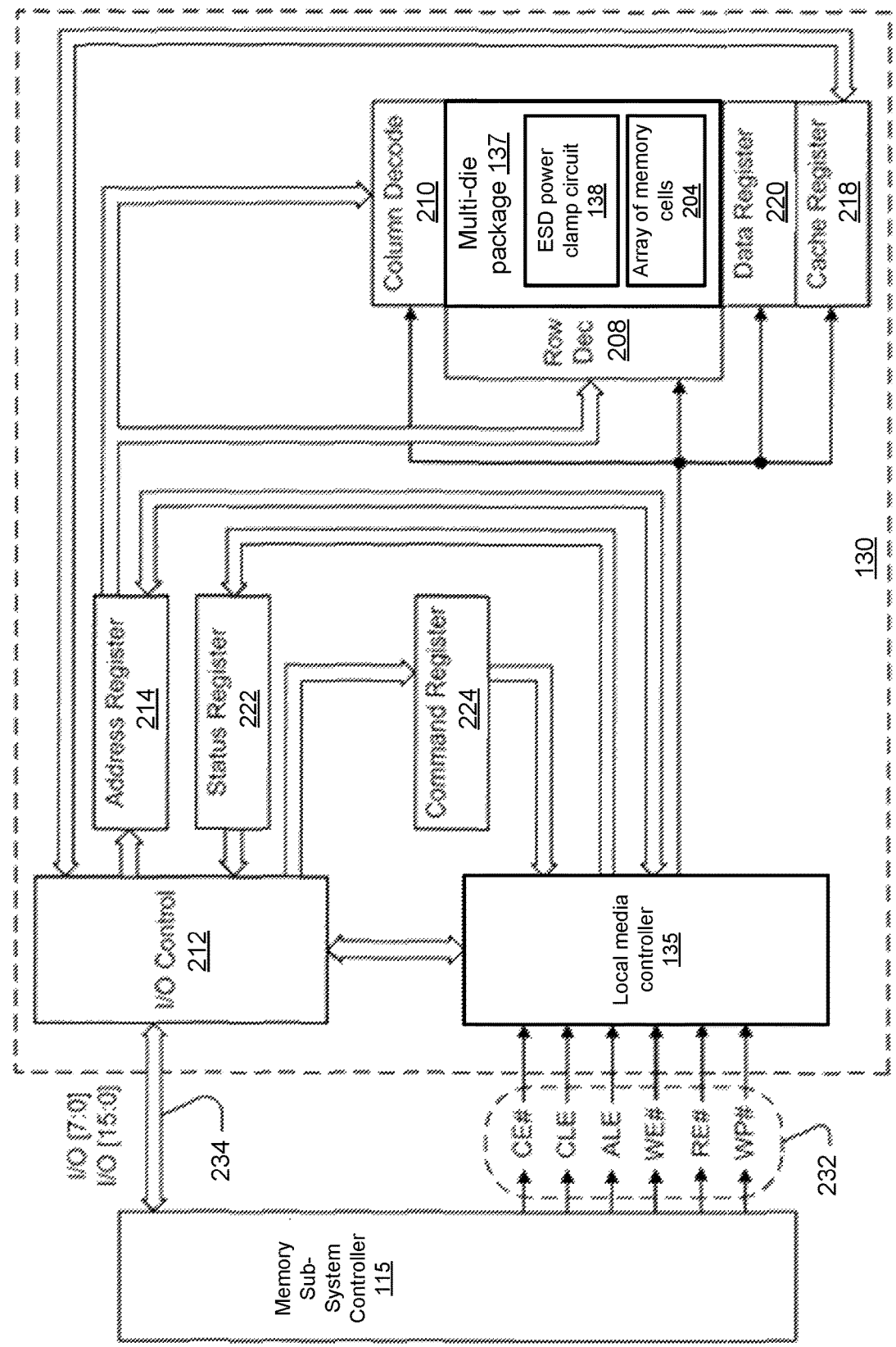
FIG. 2 is a block diagram of a memory device in communication with a memory sub-system controller of a memory sub-system, in accordance with one or more embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column.

In an embodiment, the memory device 100 includes a multi-die package 137 including multiple memory dies arranged on a substrate. In an embodiment, the multi-die package 137 includes one or more ESD power clamp circuits 138 including associated ESD power clamp contact pads, as described herein. In an embodiment, the multi-die package 137 includes memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 28 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data may be passed from the cache register 218 to the data register 22 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals may include a chip enable CE #, a command latch enable CLE, an address latch enable ALE, a write enable WE #, a read enable RE #, and a write protect WP #. Additional or alternative control signals (not shown) may be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [7:0] for a 8-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [7:0] for an 8-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) may be used in the various embodiments.

According to embodiments, the memory device 130 includes multiple memory dies arranged in a stack on a substrate. Each of the memory dies of the multi-die package 137 of the memory device 130 includes a power supply and an ESD power clamp circuit 138 for providing ESD protection to the memory device 130. The memory dies also include a first set of one or more dedicated contact pads associated with the power supply and a second set of one or more dedicated contact pads associated with the ESD power clamp circuit.

In an embodiment, each ESD power clamp circuit is associated with a dedicated contact pad. In an embodiment, use of the dedicated contact pad for the ESD power clamp circuit enables different packaging densities using multiple memory dies having a same structure and layout, while providing a desired amount of ESD protection while reducing or managing a peak current level consumed during a power-up operation of the memory device 130. In addition, a reduced or lower level of standby current is consumed as a result of one or more ESD power clamp circuits being disconnected (e.g., unbonded).

Figure 3:
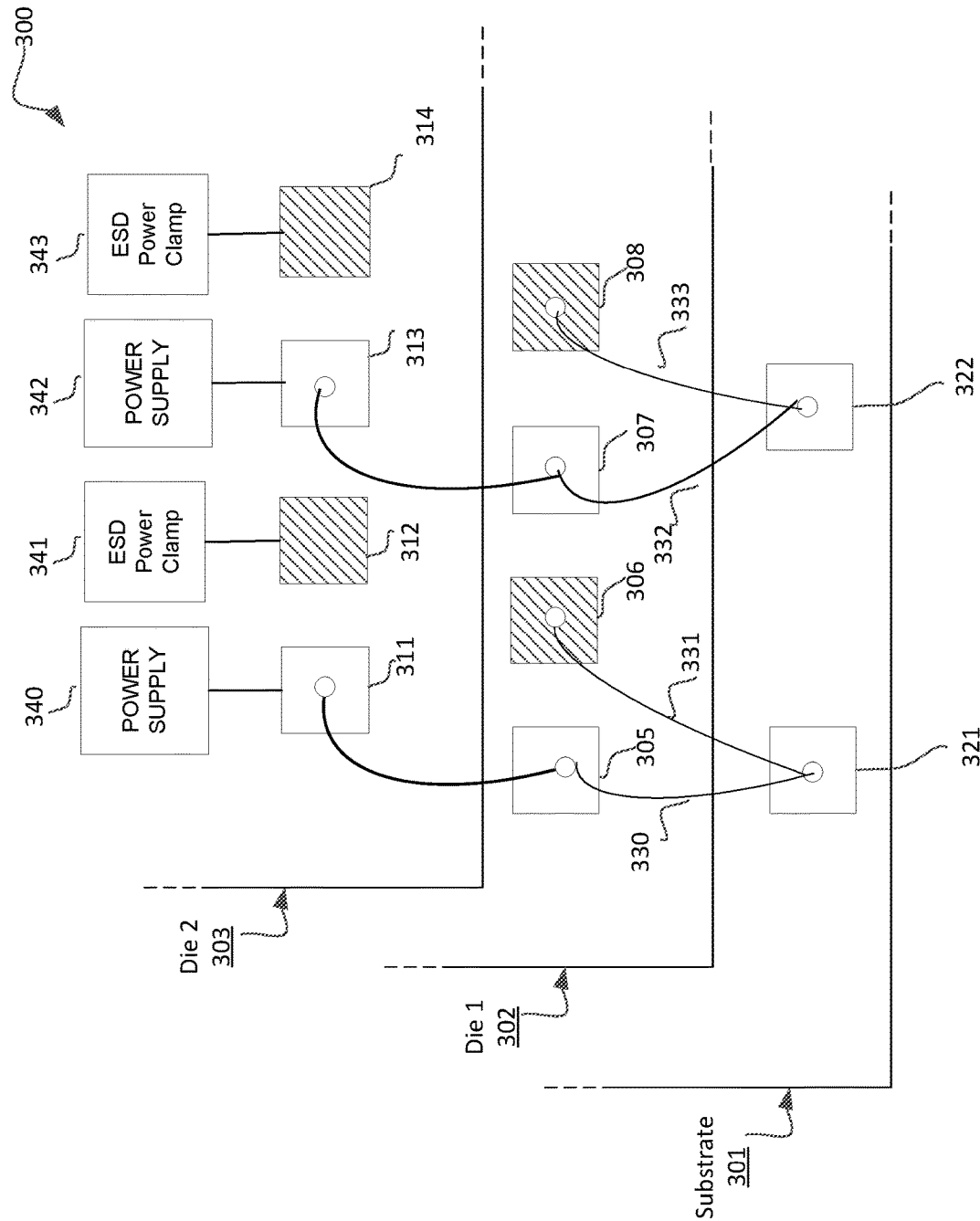
FIGS. 3-6 are schematic views of multi-die memory device assemblies, in accordance with embodiments of the present disclosure.

FIG. 3 is a simplified schematic illustration of an example semiconductor device assembly including multiple semiconductor dies. In the example shown in FIG. 3, the semiconductor device assembly is a memory device assembly 300 including multiple memory dies (e.g., a double die package or DDP), according to embodiments of the present disclosure. As shown, the memory device assembly 300 includes a substrate 301 and two memory dies 302 and 303 (e.g., memory dies having an identical or same structure). In an embodiment, each memory die 302 and 303 includes multiple contact pads, such as first through fourth contact pads 305-308 of memory die 302 and fifth through eighth contact pads 311-314, each providing connectivity to either a circuit with active components (e.g., a power supply circuit) or a circuit with passive components (e.g., an ESD power clamp circuit). For example, as shown in FIG. 3, contact pad 311 provides connectivity to a first power supply circuit 340, contact pad 312 provides connectivity to a first ESD power clamp circuit 341, contact pad 313 provides connectivity to a second power supply circuit 342, and contact pad 314 provides connectivity to a second ESD power clamp circuit 343.

In an embodiment, the first contact pad 305 and the third contact pad 307 correspond to a power side of the first memory die 302. In this embodiment, the first contact pad 305 is electrically coupled to a positive power supply (e.g., VCCQ) of the first memory die 302. In an embodiment, first contact pad 305 and the third contact pad 307 correspond to a ground side of the first memory die 302 (e.g., 0 volts or VSSQ). In an embodiment, the first contact pad 305 corresponds to a power side of the first memory die 302 and the third contact pad 307 corresponds to a ground side of the first memory die 303.

Because each ESD power clamp circuit is provided with a dedicated contact pad (e.g., contact pads 306, 308, 312, and 314, the assembly 300 can be configured with a desired amount of ESD protection for each power supply circuit while managing the contribution to the peak current consumption level during powering on of the memory device and overall current consumption levels (e.g., standby or leakage current levels) during operation of the memory device.

As can be seen with reference to FIG. 3, the substrate 301 includes two substrate contacts 321 and 322. The first substrate contact 321 (e.g., interface pin 1) is connected (e.g., by wirebonds 330) to the first contact pad 305 of the memory die 302 and the fifth contact pad 311 of the memory die 303 (corresponding to a power supply circuit 340). In an embodiment, substrate contact 321 is connected (e.g., by wirebonds 331) to the second contact pad 306 of the memory die 302 (corresponding to an ESD power clamp circuit 312). In addition, as shown in FIG. 3, the second substrate contact 322 (e.g., interface pin 2) is connected (e.g., by wirebonds 332) to a third contact pad 307 of the memory die 302 and a seventh contact pad 313 of the memory die 303 (corresponding to a power supply circuit 342). In an embodiment, for memory die 302, substrate contact 322 is connected (e.g., by wirebonds 333) to the fourth contact pad 308 of the memory die 302 (corresponding to an ESD power clamp circuit 312).

As shown, the fifth contact pad 312 and the eighth contact pad 314 of memory die 303 are not connected (e.g., are electrically isolated) from the substrate contacts 321 and 322. Accordingly, the corresponding ESD power clamp circuits (e.g., 341 and 343) are disconnected and do not consume current during a powering on of the memory device 300 or during operation of the memory device 300. By leaving the second and fourth contact pads 312 and 314 (corresponding to ESD protection circuits) on the upper memory die 303 electrically disconnected from the substrate contacts 321 and 322, the overall peak current level consumed during powering on of the memory device is less than it would be if the ESD power clamp circuits from each memory die in the assembly 300 were connected. In addition, the overall standby current consumed is also reduced as compared to an assembly wherein all of the ESD power clamp circuits of each memory die were connected and consuming current.

Although FIG. 3 has been described and illustrated as including multiple identical memory dies, in other embodiments, memory device assemblies with different types of memory dies can be provided with similar features. For example, in one embodiment, a memory device assembly can include a logic die and a memory die, one or both of which can include discrete contact pads for passive circuits to be connected as desired during packaging. Moreover, although FIG. 3 has been described and illustrated as including memory dies with two power supply circuits, it will be readily apparent to those skilled in the art that this embodiment is but one example, and memory dies with different numbers of power supply circuits can also be provided. Furthermore, FIG. 3 has been described and illustrated as providing contact pads for ESD power clamp circuits that are separate from contact pads for the power supply circuits, in other embodiments, circuits with other active elements besides power supply circuits can be provided, and other circuits including only passive components (e.g., resistors, capacitors, inductors, etc.) can likewise be provided.

Although FIG. 3 has been described and illustrated with multiple wirebonds at each substrate contact 321 and 322 for providing connectivity to multiple contact pads in one of the semiconductor dies 302 in the assembly 300, in other embodiments, other wirebond arrangements can be used. In an embodiment, the first substrate contact 321 can be connected to the second contact pad 312 (corresponding to an ESD power clamp circuit) of only one memory die 302 in the assembly 300 using a wirebond (not shown in FIG. 3) between the first contact pad 311 and the second contact pad 312 of the memory die 302.

Figure 4:
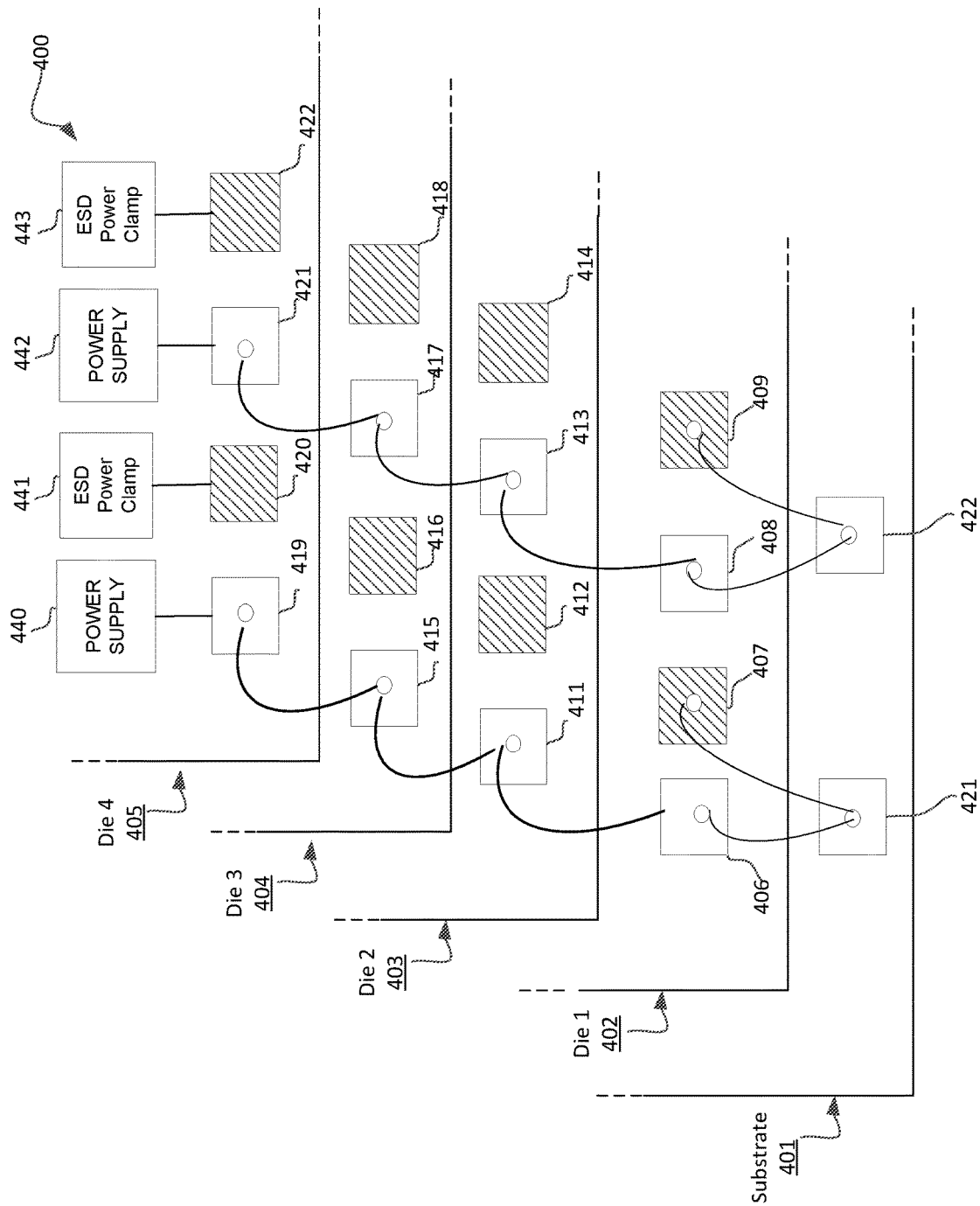

FIG. 4 is a simplified schematic illustration of an example semiconductor device (e.g., a memory device assembly 400 including multiple memory dies (e.g., a quad die package or QDP)), according to embodiments of the present disclosure. As shown, the memory device assembly 400 includes a substrate 401 and four memory dies 402, 403, 404, and 405 (e.g., memory dies having an identical or same structure). In an embodiment, each memory die 402-405 includes multiple contact pads, such as first through fourth contact pads 406-409 of memory die 402, fifth through eighth contact pads 411-414, ninth through twelfth contact pads 47-418 of memory die 404, and thirteenth through sixteenth contact pads 419-422 of memory die 405 each providing connectivity to either a circuit with active components (e.g., a power supply circuit such as 440 and 442) or a circuit with passive components (e.g., an ESD power clamp circuit such as 441 and 443). For example, as shown in FIG. 4, contact pad 419 provides connectivity to a first power supply circuit 440, contact pad 420 provides connectivity to a first ESD power clamp circuit 441, contact pad 413 provides connectivity to a second power supply circuit 442, and contact pad 414 provides connectivity to a second ESD power clamp circuit 444.

As shown in FIG. 4, the memory device assembly includes a set of dedicated contact pads (e.g., contact pads 407, 409, 412, 414, 416, 418, 420, and 422) that can provide connectivity to a corresponding ESD power clamp circuit (also referred to a "set of ESD contact pads). In an embodiment, as shown in FIG. 4, only the contact pads 407 and 409 (of memory die 402) of the set of ESD contact pads are electrically connected to the substrate contact pads (e.g., 421 and 422). Accordingly, the remaining ESD contact pads (e.g., contact pads 412, 414, 416, 418, 420, and 422) of the set of ESD contact pads are configured to be electrically disconnected from the substrate contacts. Accordingly, while the ESD power clamps corresponding to the electrically connected ESD contact pads (e.g., contact pads 407 and 409) provide ESD protection to the memory device 400, the disconnected ESD contact pads do not contribute to the peak current level during powering on of the memory device 400 or an overall current consumption level (e.g., standby or leakage current) of the memory device 400.

Figure 5:
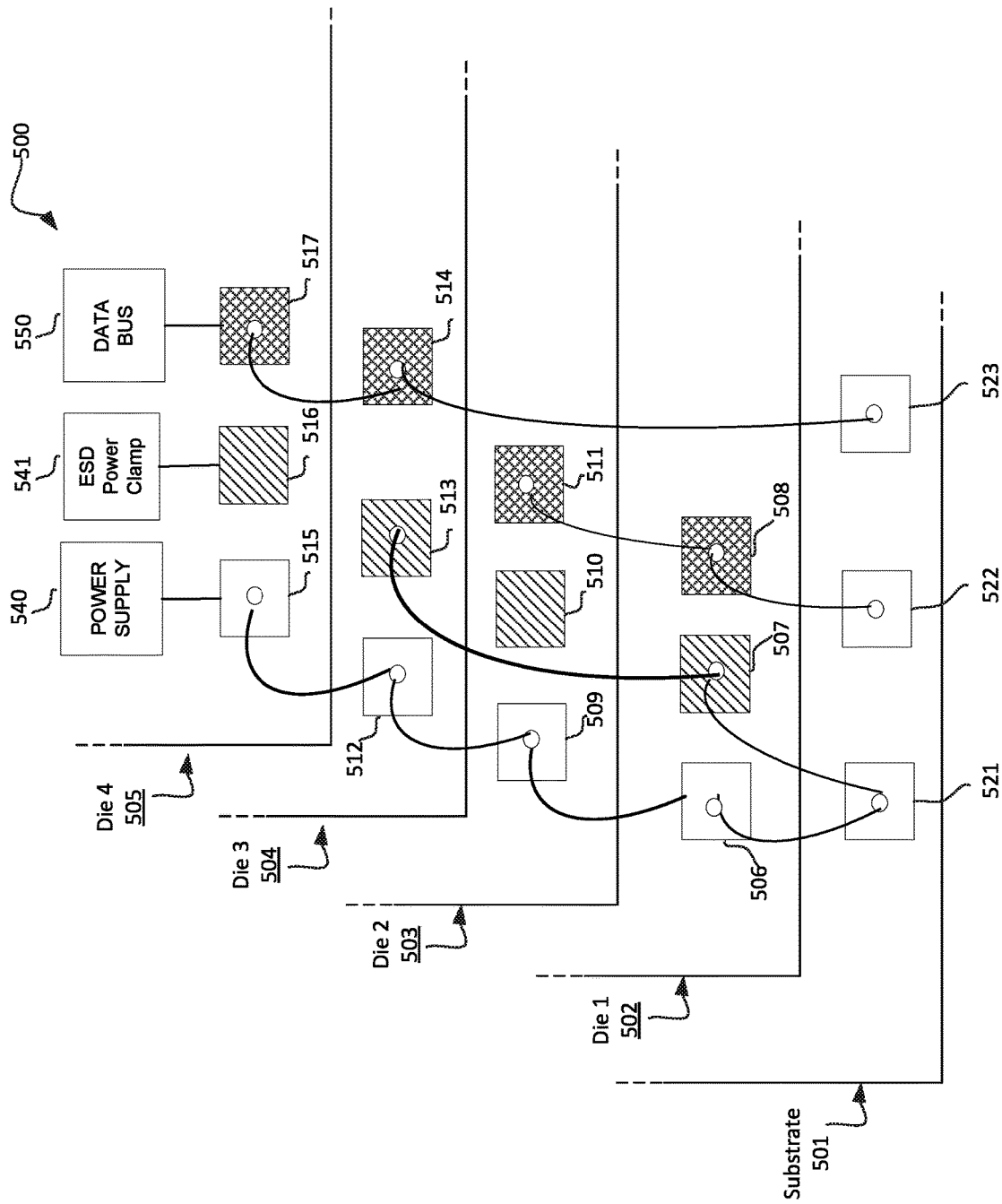

FIG. 5 is a simplified schematic illustration of an example semiconductor device assembly (e.g., a memory device package 500 including multiple memory dies and one or more data bus circuits), according to embodiments of the present disclosure. As shown, the memory device assembly 500 includes a substrate 501 and four memory dies 502, 503, 504, and 505 (e.g., memory dies having an identical or same structure). In an embodiment, each memory die 502-505 includes multiple contact pads, such as first through third contact pads 506-508 of memory die 502, fourth through sixth contact pads 509-511, seventh through ninth contact pads 512-514 of memory die 504, and thirteenth through sixteenth contact pads 515-517 of memory die 505 each providing connectivity to either a circuit with active components (e.g., a power supply circuit such as 540), a circuit with passive components (e.g., an ESD power clamp circuit such as 541), or a data bus (e.g., data bus 550). For example, as shown in FIG. 5, contact pad 515 provides connectivity to a first power supply circuit 540, contact pad 516 provides connectivity to a first ESD power clamp circuit 541, and contact pad 517 provides connectivity to a data bus 550.

As shown in FIG. 5, a portion of the set of dedicated contact pads associated with the ESD power clamp circuit (e.g., contact pads 510 and 516 are disconnected from the substrate contacts (e.g., contacts 521, 522 and 523). In an embodiment, each of the set of contacts pads associated with the data bus 550 (e.g., contact pads 508, 511, 514, and 517) are electrically connected to a substrate contact (e.g., an I/O pin 522, 523).

Figure 6:
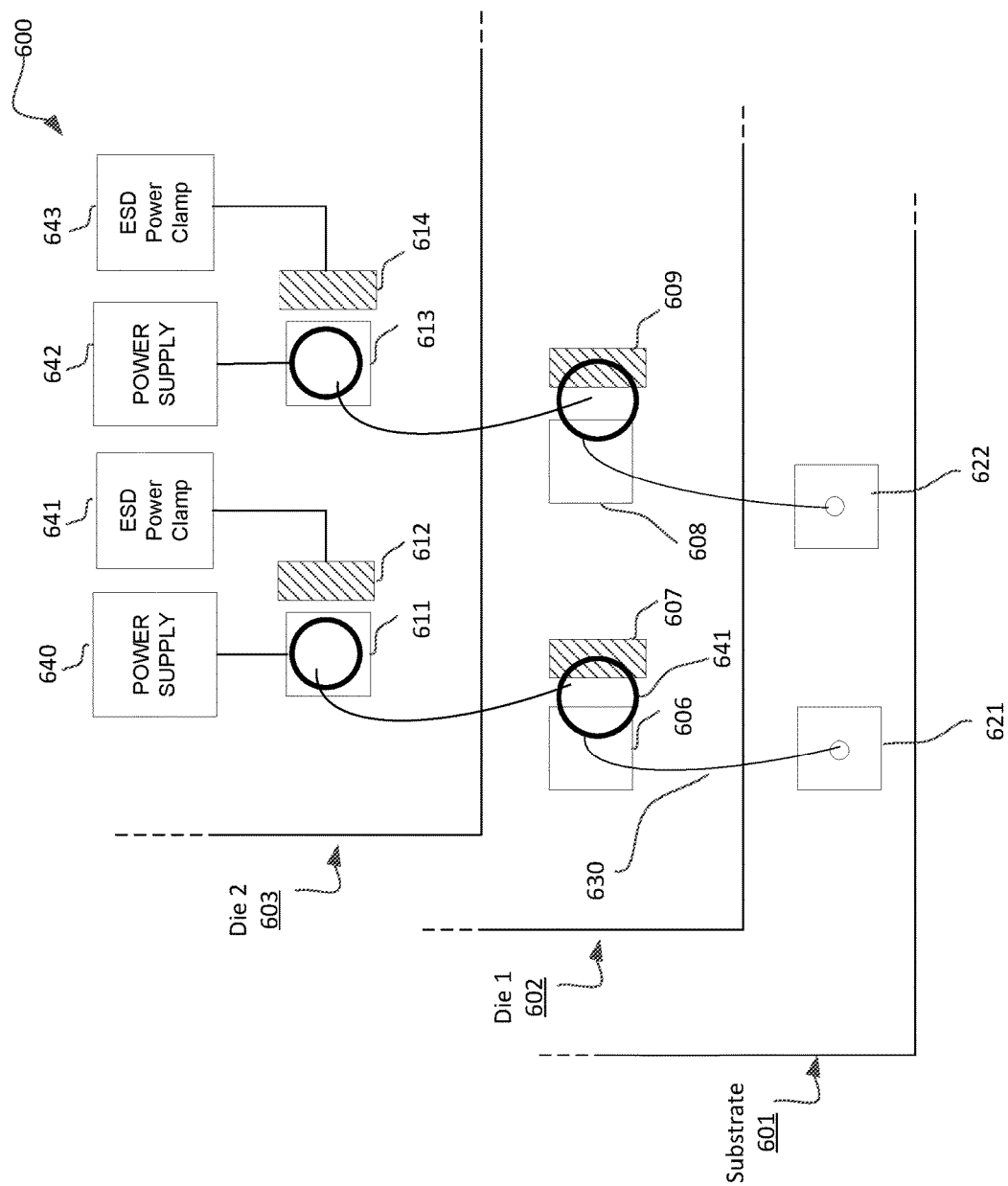

Although in the foregoing embodiments the dedicated contact pad for each connected ESD power clamp circuit is illustrated and described as having a corresponding dedicated wirebond, in other embodiments, the contact pads can be connected in other ways. For example, FIG. 6 illustrates a simplified schematic view of a semiconductor device assembly (e.g., a memory device assembly 600) in accordance with an embodiment of the present disclosure. Assembly 600 includes a substrate 601 and two memory dies 602 and 603 (e.g., memory dies having a same physical structure and layout). Each memory die 602 and 603 includes multiple contact pads, such as first through fourth contact pads 606-609 of memory die 501 and fifth through eighth contact pads 611-614 of memory die 602, each providing connectivity to either a circuit with active components (e.g., power supply circuit 640, 642) or a circuit with passive components (e.g., an ESD power clamp circuit 641, 643). As shown in FIG. 6, ESD power clamp contact pads 607, 609 612 and 614 are disposed immediately adjacent the corresponding power supply contact pads 606, 608, 611, and 613, respectively, so that a single wirebond 630 can be used to connect both pads.

As can be seen with reference to FIG. 6, the substrate 601 includes two substrate contacts 621 and 622. The first substrate contact 621 is connected by a single wirebond 630 to both the first contact pad 606 (corresponding to a power supply circuit) and the second contact pad 607 (corresponding to an ESD power clamp circuit) of the first semiconductor die 602 (e.g., with a solder bond 641). The first substrate contact 621 is further connected by a wirebond between the solder bond 641 connecting the first and second contact pads 606 and 607 of the first memory die 602 and the fifth contact pad 611 (corresponding to a power supply circuit) of the second memory die 603. Similarly, the second substrate contact 622 is connected by a single wirebond to both the third contact pad 608 and seventh contact pad 613 (corresponding to a power supply circuit) and the fourth contact pad 609 (corresponding to an ESD protection circuit) of the first memory die 602 (e.g., with a solder bond). The second substrate contact 622 is further connected by a wirebond between the solder bond connecting the third and fourth contact pads 608 and 609 of the first memory die 602 and the seventh contact pad 613 (corresponding to a power supply circuit) of the second memory die 603.

Figure 7:
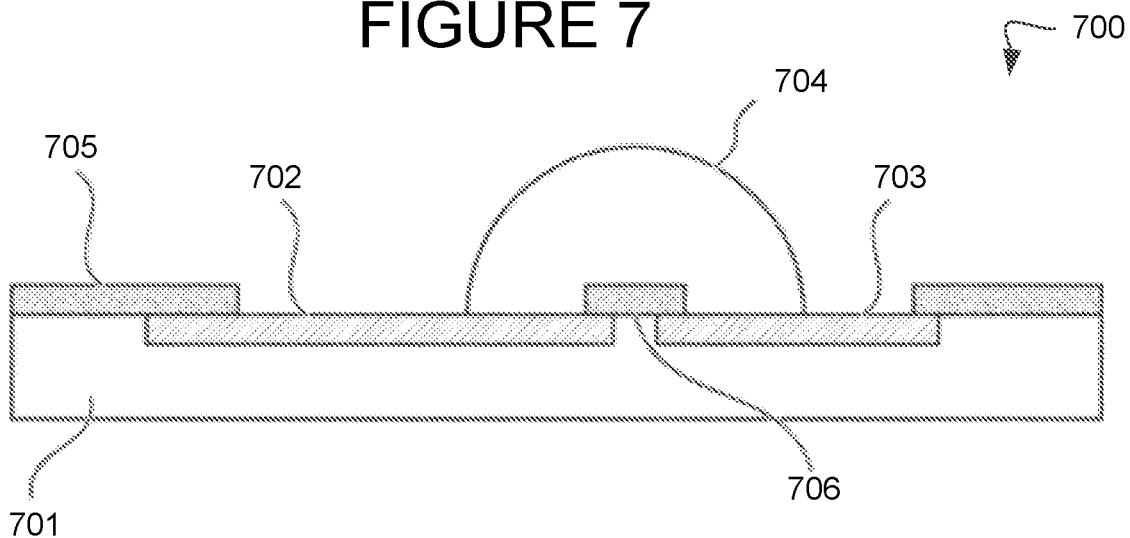
FIGS. 7-9 are simplified partial cross-sectional views of memory device assemblies in accordance with embodiments of the present disclosure.

According to embodiments of the present disclosure, memory dies with closely-spaced bond pads for optionally connecting any number of different circuits, with any desired function in addition to or in lieu of ESD power clamp circuits and power supply circuits can be configured. Moreover, closely-spaced bond pads, such as those illustrated in the examples of FIGS. 3-6 above, can be provided in any one of a number of ways. For example, FIG. 7 illustrates a simplified partial cross-sectional view of a semiconductor device (e.g., memory device 700) in accordance with an embodiment of the present technology. In the memory device 701 illustrated in FIG. 7, closely spaced bond pads 702 and 703 are provided under a layer of passivation or polymide material 705, and therefore separated by a small region 706 of the passivation or polymide material. A solder ball 704 of sufficient volume can be provided to bridge this region 706 of passivation or polymide material, and therefore connect the closely spaced bond pads 702 and 703.

Figure 8:
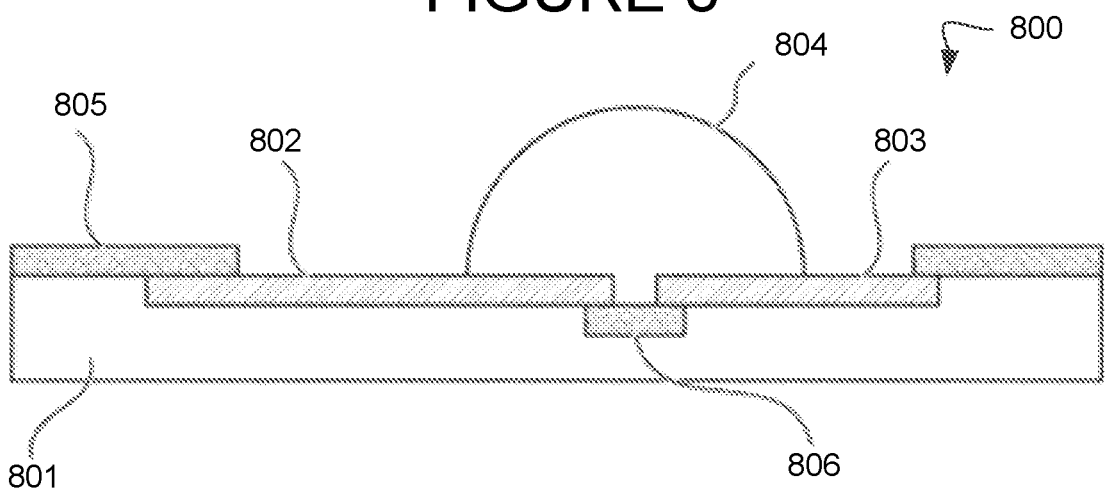

By way of further example, FIG. 8 illustrates a simplified partial cross-sectional view of another semiconductor device (e.g., a memory device 800) in accordance with an embodiment of the present technology. In the memory device 801 illustrated in FIG. 8, closely spaced bond pads 802 and 803 are provided under a layer of passivation or polymide material 805, but additional process steps have been undertaken to eliminate the passivation or polymide material 805 from between the closely spaced bond pads 802 and 803 (e.g., by including an etch stop material 806 under the region between the closely spaced bond pads 802 and 803, to permit etching away the passivation or polymide material 805 from between them). This arrangement facilitates easily connecting a solder ball 804 to both the closely spaced bond pads 802 and 803 (due to the absence of non-wettable material between them).

Figure 9:
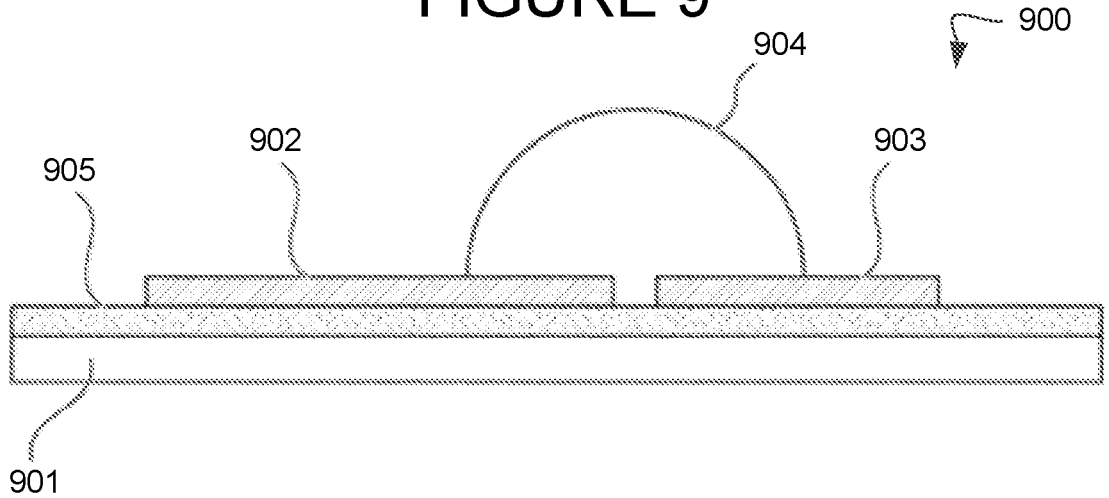

In yet another embodiment, FIG. 9 illustrates a simplified partial cross-sectional view of another semiconductor device (e.g., a memory device 900) in accordance with an embodiment of the present technology. In the memory device 901 illustrated in FIG. 9, closely spaced bond pads 902 and 903 are provided over a layer of passivation or polymide material 905 (e.g., in a redistribution layer). This arrangement also facilitates easily connecting a solder ball 904 to both the closely spaced bond pads 902 and 903 (due to the absence of non-wettable material between them).

Although in the foregoing examples memory device packages have been illustrated in which circuits with passive elements (e.g., ESD protection circuits) have been illustrated and described with dedicated contact pads for providing connectivity via wirebonds, those skilled in the art will readily understand that other methods of die-to-die or die-to-substrate connectivity can also be used to provide package-level connection configurability. For example, semiconductor dies in which circuits of passive components have dedicated TSVs can be arranged in non-shingled stacks, with optional connectivity provided by the inclusion or omission of solder joints between adjacent TSVs in the stack. Other interconnection techniques can likewise be provided.

Moreover, although in the foregoing examples semiconductor device assemblies (e.g., memory device assemblies) have been described as including a single stack of semiconductor dies, in other embodiments of the present technology, a memory device assembly can include multiple stacks of semiconductor dies in which passive circuits can optionally be connected via dedicated contact pads. For example, in one embodiment of the present technology, a memory device assembly can include multiple laterally-separated stacks of semiconductor dies (e.g., two stacks of four dies each, two stacks of eight dies each, four stacks of four dies each, etc.) in which less than all of the available ESD circuits in each stack are electrically coupled to an active circuit. In another embodiment, a memory device assembly can include a single stack of semiconductor dies in which subsets of the dies in the stack are separately connected to the substrate (e.g., a shingled stack with eight dies grouped as a first subset electrically coupled to the substrate, with less than all of the available dies in the first subset having electrically coupled ESD circuits, and another eight dies above the first eight dies, with a shingle offset direction opposite that of the first subset, grouped as a second subset electrically coupled to the substrate separately from the first subset, with less than all of the available dies in the second subset having electrically coupled ESD circuits, etc.).

Figure 10:
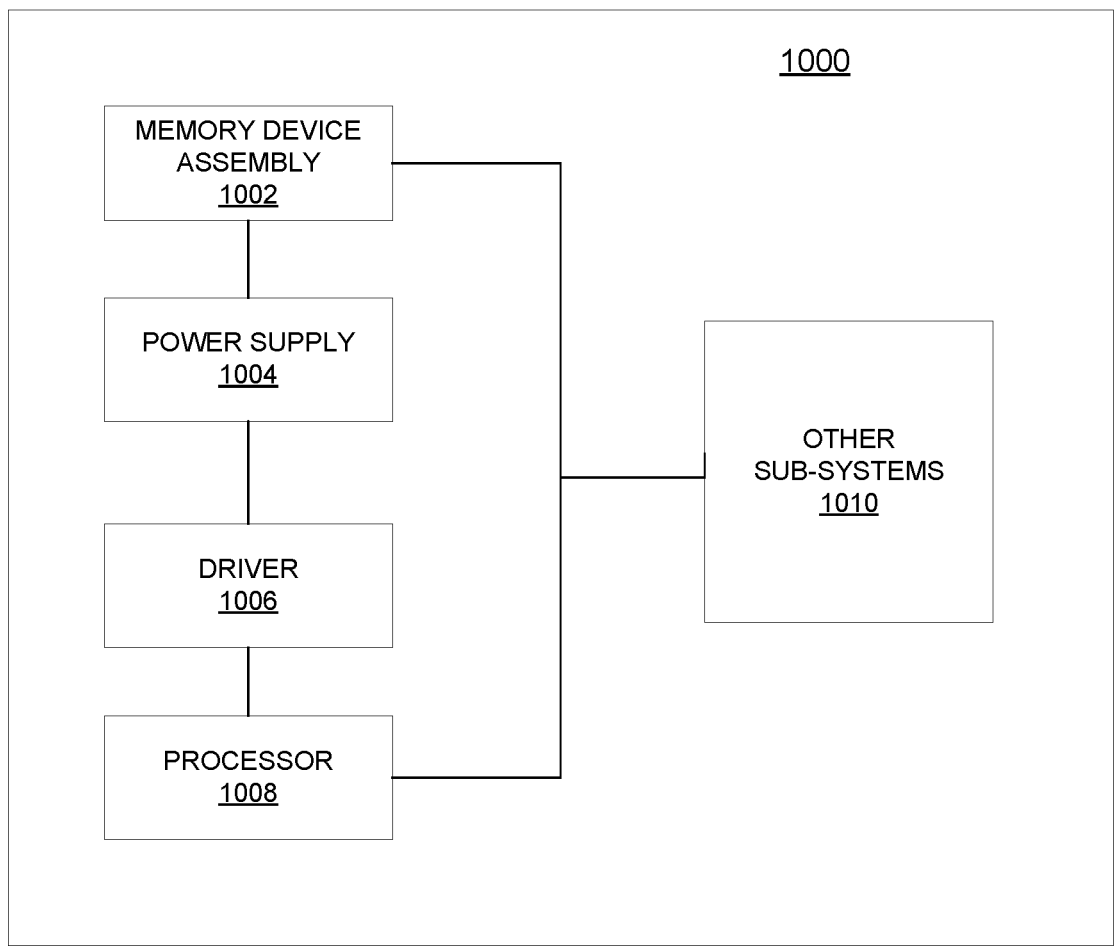
FIG. 10 is a schematic view showing a system that includes a memory device in accordance with embodiments of the present disclosure.

Any one of the memory device assemblies described above with reference to FIGS. 3-9 can be incorporated into any of a myriad of larger and/or more complex systems, a representative example of which is system 1000 shown schematically in FIG. 10. The system 1000 can include a memory device assembly 1002, a power source 1004, a driver 1006, a processor 1008, and/or other subsystems or components 1010. The memory device assembly 1002 can include features generally similar to those of the memory devices described above with reference to FIGS. 3-9. The resulting system 1000 can perform any of a wide variety of functions, such as memory storage, data processing, and/or other suitable functions. Accordingly, representative systems 1000 can include, without limitation, hand-held devices (e.g., mobile phones, tablets, digital readers, and digital audio players), computers, vehicles, appliances and other products. Components of the system 1000 may be housed in a single unit or distributed over multiple, interconnected units (e.g., through a communications network). The components of the system 1000 can also include remote devices and any of a wide variety of computer readable media.

Figure 11:
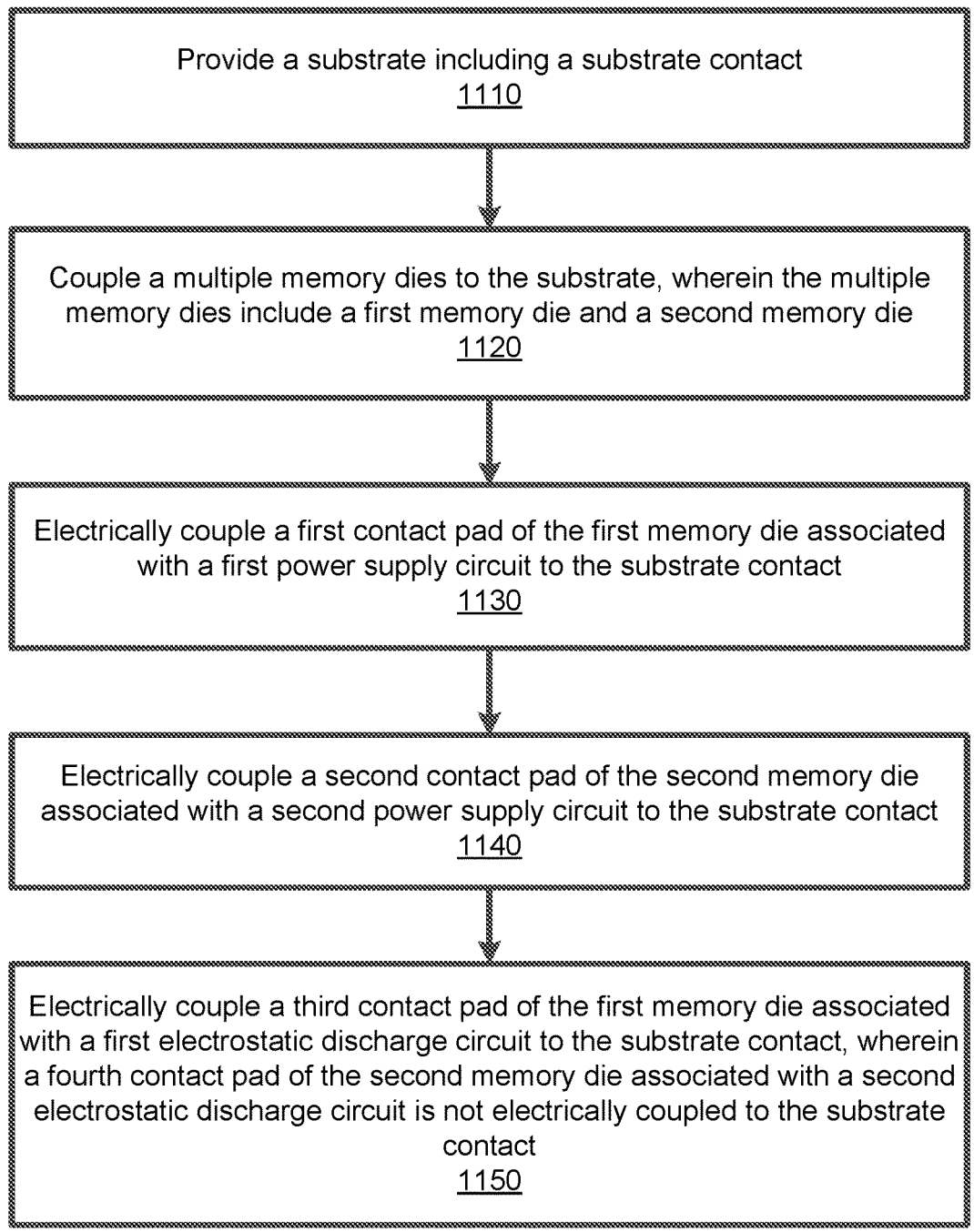
FIG. 11 is a flow chart illustrating an example method of making a memory device assembly in accordance with embodiments of the present disclosure.

FIG. 11 is a flow chart illustrating an example method of making or configuring of a memory device assembly, according to embodiments of the present disclosure. At operation 1110, a substrate is provided. For example, a substrate including at least one substrate contact of a memory device assembly is provided. The at least one substrate contact can be a pin or contact associated with an I/O interface of a memory sub-system.

At operation 1120, a coupling is performed. For example, multiple memory dies are couple to the substrate. In an example, the multiple memory dies include a first memory die and second memory die arranged in a stack assembled upon and coupled to the substrate.

At operation 1130, an electrical coupling is performed. For example, a first contact pad of the first memory die is electrically coupled to the substrate contact. In an embodiment, the first contact pad is associated with a first power supply (e.g., a power supply of the first memory die).

At operation 1140, an electrical coupling is performed. For example, a second contact pad of the second memory die is electrically coupled to the substrate contact. In an embodiment, the first contact pad is associated with a second power supply (e.g., a power supply of the second memory die).

At operation 1150, an electrical coupling is performed. For example, a third contact pad of the first memory die is electrically coupled to the substrate contact. In an embodiment, the first contact pad is associated with an ESD power clamp circuit (e.g., an ESD power clamp circuit of the first memory die). In an embodiment, a fourth contact pad of the second memory die associated with an ESD power clamp circuit (e.g., an ESD power clamp circuit of the second memory die) is not electrically coupled to the substrate contact.

In an embodiment, the first memory die and second memory die have a same arrangement (e.g., each has a contact pad associated with a power supply and a dedicated contact pad associated with an ESD power clamp circuit). In an embodiment, by not connecting the ESD power clamp circuit contact pad (e.g., the fourth contact pad) to the substrate contact, no current is consumed by the ESD power clamp circuit of the second memory die during a powering-on operation of the memory device. Advantageously, this reduces the peak current level during the powering-on operation, while providing for ESD protection (via the electrically coupled ESD power clamp circuit of the first memory die).

Figure 12:
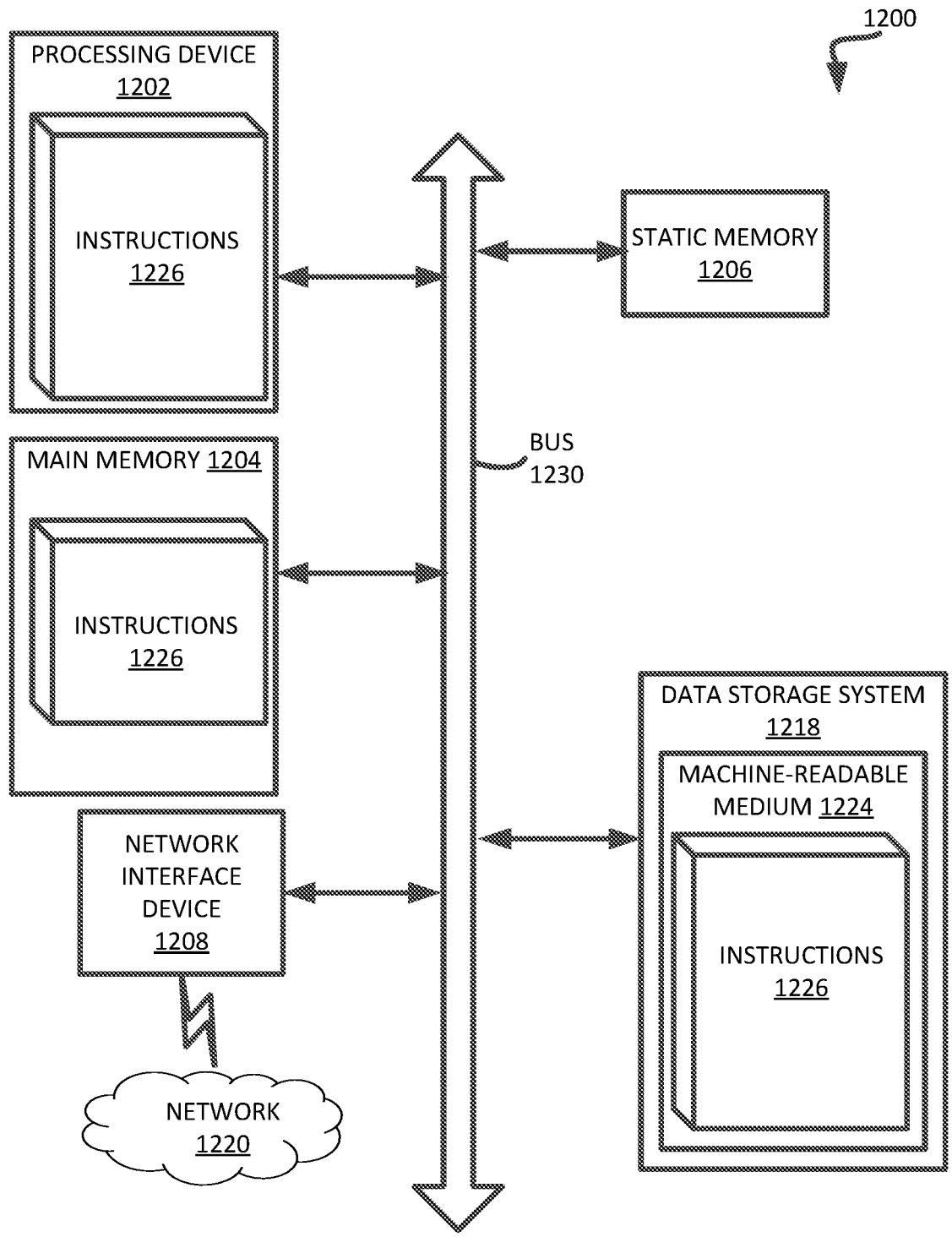
FIG. 12 is a block diagram of an example computer system in which implementations of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to memory device 130 according to embodiments of the present disclosure. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality of the memory sub-system and memory device. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
   a substrate comprising a first substrate contact, a second substrate contact, and a third substrate contact;
   a first memory die coupled to the substrate, the first memory die comprising:
     a first power supply contact pad electrically coupled to the first substrate contact and a first power supply circuit on the first memory die;
     a first electrostatic discharge (ESD) power clamp contact pad electrically coupled to the first substrate contact and a first ESD power clamp circuit on the first memory die; and
     a first data bus contact electrically coupled to the second substrate contact and a first data bus on the first memory die;
   a second memory die comprising:
     a second power supply contact pad electrically coupled to the first substrate contact and a second power supply circuit on the second memory die;
     a second ESD power clamp contact pad electrically coupled to a second ESD power clamp circuit on the second memory die, wherein the second ESD power clamp contact pad is electrically disconnected from the first substrate contact and the second substrate contact; and
     a second data bus contact electrically coupled to the second substrate contact and a second data bus on the second memory die; and
   a third memory die comprising a third data bus contact electrically coupled to the third substrate contact and a third data bus on the third memory die.

2. The device of claim 1, wherein the first memory die and the second memory die comprise a same physical arrangement.

3. The device of claim 1, wherein the first memory die and the second memory die are arranged in a stack coupled to the substrate.

4. The device of claim 1, wherein the first ESD power clamp circuit comprises one or more passive circuit elements and one or more active circuit elements to provide ESD protection to the first memory die and the second memory die.

5. The device of claim 1, wherein the second ESD power clamp circuit does not contribute to a peak current level of the device during a power on operation of the device.

6. The device of claim 1, wherein the first substrate contact is electrically coupled to the first power supply contact pad and the first ESD power clamp contact pad by a single wirebond and a single solder ball.

7. The device of claim 1, wherein the first substrate contact is electrically coupled to the second power supply contact pad by a wirebond between the first power supply contact pad and the second power supply contact pad.

8. The device of claim 1, wherein the second ESD power clamp circuit does not contribute to an overall current consumption level of the device.

9. The device of claim 1, wherein the first power supply contact pad corresponds to a positive voltage supply of the first memory die.

10. The device of claim 1, wherein the first power supply contact pad corresponds to a ground voltage supply of the first memory die.

11. The device of claim 1, wherein the first memory die comprises a third power supply contact pad.

12. The device of claim 11, wherein the first power supply contact pad corresponds to a positive voltage supply of the first memory die and the third power supply contact pad corresponds to a ground voltage supply of the first memory die.

13. A system comprising:
a controller; and
a memory device coupled to the controller, the memory device comprising:
a substrate comprising a first substrate contact a second substrate contact, and a third substrate contact;
a first memory die coupled to the substrate, the first memory die comprising:
a first power supply contact pad electrically coupled to the first substrate contact and a first power supply circuit on the first memory die;
a first electrostatic discharge (ESD) power clamp contact pad electrically coupled to the first substrate contact and a first ESD power clamp circuit on the first memory die; and
a first data bus contact electrically coupled to the second substrate contact and a first data bus on the first memory die;
a second memory die comprising:
a second power supply contact pad electrically coupled to the first substrate contact and a second power supply circuit on the second memory die;
a second ESD power clamp contact pad electrically coupled to a second ESD power clamp circuit on the second memory die, wherein the second ESD power clamp contact pad is electrically disconnected from the second substrate contact; and a second data bus contact electrically coupled to the second substrate contact and a second data bus on the second memory die; and
a third memory die comprising a third data bus contact electrically coupled to the third substrate contact and a third data bus on the third memory die.

14. The system of claim 13, wherein the first memory die and the second memory die comprise a same physical arrangement.

15. The system of claim 13, wherein the first memory die and the second memory die are arranged in a stack coupled to the substrate.

16. The system of claim 13, wherein the first ESD power clamp circuit comprises one or more passive circuit elements and one or more active circuit elements to provide ESD protection to the first memory die and the second memory die; and wherein the second ESD power clamp circuit does not contribute to a peak current level of the memory device during a power on operation of the memory device.

17. The system of claim 13, wherein the first power supply contact pad corresponds to a positive voltage supply of the first memory die.

18. The system of claim 13, wherein the first power supply contact pad corresponds to a ground voltage supply of the first memory die.

19. The system of claim 13, wherein the first memory die comprises a third power supply contact pad; and wherein the first power supply contact pad corresponds to a positive voltage supply of the first memory die and the third power supply contact pad corresponds to a ground voltage supply of the first memory die.

20. A semiconductor device comprising:
a substrate comprising a first substrate contact a second substrate contact and a third substrate contact;
a first memory die coupled to the substrate, the first memory die comprising:
a first power supply contact pad electrically coupled to the first substrate contact and a first power supply circuit on the first memory die;
a first electrostatic discharge (ESD) power clamp contact pad electrically coupled to the first substrate contact and a first ESD power clamp circuit on the first memory die; and
a first data bus contact electrically coupled to the second substrate contact and a first data bus on the first memory die;
a second memory die comprising:
a second power supply contact pad electrically coupled to the first substrate contact and a second power supply circuit on the second memory die;
a second ESD power clamp contact pad electrically coupled to a second ESD power clamp circuit on the second memory die, wherein the second ESD power clamp contact pad is electrically disconnected from the second substrate contact; and
a second data bus contact electrically coupled to the second substrate contact and a second data bus on the second memory die; and
a third memory die comprising a third data bus contact electrically coupled to the third substrate contact and a third data bus on the third memory die.

* * * * *